United States Patent [19]

Barlow et al.

[11] 4,204,933
[45] May 27, 1980

[54] ELECTROCOATING PROCESS FOR PRODUCING A SEMICONDUCTING FILM

[75] Inventors: William A. Barlow; Maurice Rhodes; Francis R. Sherliker; Edward W. Williams, all of Runcorn, England

[73] Assignee: Imperial Chemical Industries Limited, London, England

[21] Appl. No.: 955,244

[22] Filed: Oct. 27, 1978

[30] Foreign Application Priority Data

Nov. 15, 1977 [GB] United Kingdom ............... 47443/77

[51] Int. Cl.² ...................... C25C 15/00; C25D 13/02
[52] U.S. Cl. ........................... 204/181 N; 204/181 E; 204/192 P; 204/192 S; 427/74; 427/76
[58] Field of Search ........... 204/181 R, 181 N, 181 E, 204/192 S, 192 P; 427/74, 55, 76, 126, 115, 372, 374; 148/1.5

[56] References Cited

U.S. PATENT DOCUMENTS

| | | | |
|---|---|---|---|
| 3,573,190 | 3/1971 | Bloom | 204/192 S |
| 3,766,125 | 10/1973 | Hansen et al. | 204/181 N |
| 3,879,276 | 4/1975 | Underwood et al. | 204/181 W |
| 4,011,149 | 3/1977 | Nozik | 204/192 S |
| 4,034,127 | 7/1977 | Busanovich et al. | 427/76 |
| 4,098,617 | 7/1978 | Lidovenko et al. | 427/76 |
| 4,101,341 | 7/1978 | Selder | 427/76 |
| 4,105,472 | 8/1978 | Lancaster | 148/1.5 |

*Primary Examiner*—Howard S. Williams
*Attorney, Agent, or Firm*—Cushman, Darby & Cushman

[57] ABSTRACT

Application of heat preferentially to one surface of a film of a semiconducting sulphide, sulphoselenide, selenide or telluride to establish a temperature differential between the surfaces of the film improves the electrical and photochemical properties of the film. The film may be employed in solar cells. Preferably the film is prepared by electrophoresis of a colloidal suspension of the semiconductor in an aqueous medium.

20 Claims, 2 Drawing Figures

ELECTROCOATING PROCESS FOR PRODUCING A SEMICONDUCTING FILM

PROCESS

This invention relates to a method for the preparation of semiconductor thin films (i.e. films of thickness of the order of 50 nm to 50,000 nm) and especially to the preparation of films which are substantially free from "pinholes". The invention relates particularly to the preparation of films comprising a semiconducting sulphide, sulphoselenide, selenide or telluride.

Our pending British Patent Application No 20199/76 describes the preparation of thin substantially pin-hole-free films which comprises the electrophoresis of a colloidal suspension of a semiconducting sulphide, sulphoselenide, selenide or telluride or precursor thereof in an aqueous medium, the deposition of the semiconductor or precursor thereof on a surface of a substrate and the heat treatment of the film.

The present invention provides a method for the preparation of a thin substantially pin-hole-free film which method comprises the deposition of a film of a semiconducting sulphide, sulphoselenide, selenide or telluride or precursor thereof on a surface of a substrate and the application of heat preferentially to one surface of the film to establish a temperature differential between the surfaces of the film.

While we do not exclude the possibility that the deposition may be effected by spraying, evaporation, sputtering, ion planting, screen printing or anodic growth, preferably the film is deposited by electrophoretic deposition, particularly preferably by electrophoresis of a colloidal suspension of colloidal particles of the semiconductor or precursor thereof in an aqueous medium.

Where the film is heated in contact with the substrate it is preferred that the heat is applied to the surface of the film distant the substrate. Furthermore where the substrate is heat sensitive, e.g. a thermoplastic film, the temperature of the semiconducting film may be raised to hundreds of °C. with little or no deleterious effect on the substrate if the substrate is cooled, e.g. by contact with a cooling medium such as cold water.

By the phrase "semiconducting sulphide, sulphoselenide, selenide, telluride" we mean a sulphide, sulphoselenide, selenide or telluride of cadmium, zinc, mercury, copper (I), lead, or other suitable metal well known in the semiconductor art to form semiconducting sulphides, sulphoselenides, selenides or tellurides, and mixtures and alloys of these semiconductors.

Within the term "film" we include coatings and sandwiched layers of semiconducting sulphides, sulphoselenides, selenides or tellurides as hereinbefore defined having a thickness between 50 nm and 50,000 nm.

By "colloidal particles" we mean particles having an average diameter between 1 and 100 nm, and by "colloidal suspension" we mean a suspension of the colloidal particles in an aqueous medium, flocculation and hence precipitation of the particles being resisted by a sheath of charges or of surfactant on the surface of the particles. Preferably the particles have an average diameter between 5 nm and 35 nm.

By "aqueous medium" we mean water or a mixture, preferably a single phase mixture, of water and at least one water-miscible polar organic liquid, particularly preferably having a dielectric constant greater than 10 and more particularly preferably greater than 20. Organic liquids which may be employed include lower alcohols having 1 to 5 carbon atoms, diols, amides, acylnitriles, ketones, esters, ethers, amines and other organic liquids well known in the electrochemical art. More preferably the aqueous medium comprises between 5% and 50% by volume of water and between 95% and 50% by volume of organic liquid. Particularly preferably the aqueous medium comprises between 10% and 30% by volume of water and between 90% and 70% by volume of organic liquid. More particularly preferably the organic liquid is a lower alcohol having 1 to 5 carbon atoms.

Preferably the collidal suspension is prepared with no isolation of the colloidal particles. It is particularly preferred that the colloidal particles are prepared in water and that an appropriate amount of an organic liquid is then added to the water prior to electrophoresis to generate the aqueous medium. It is more particularly preferred that the semiconductor or precursor thereof is formed in the water, and is formed by a metathetical reaction. Where the semiconductor or precursor thereof is formed in water by a matathetical reaction, preferably one of the starting materials for the metathetical reaction is gaseous since this affords easy control of the reaction and ready removal of an excess of one starting material; particularly preferably one of the starting materials is hydrogen sulphide.

The "concentration" of the colloidal suspension can vary within wide limits, consistent with deposition of a film of required thickness and quality in a suitable time under the conditions employed. The "concentration" of the colloidal suspension preferably is less than 50 mMolar and particularly preferably is between 1 and 25 mMolar.

The stability of the colloidal suspension may be improved by addition of a stabiliser as is well known in the colloidal art, e.g. a low molecular weight ionic species or a surfactant. Suitable surfactants for use in the process of the invention may be anionic, cationic or non-ionic.

The substrate may be positioned, e.g. suspended, between two electrodes of opposite polarity from each other and it may be in contact with one of them. Preferably, however, the substrate is incoporated into an electrical circuit as an electrode, hereinafter referred to as the "working electrode" which may be either the anode or the cathode. The electrode of opposite charge to the working electrode will hereinafter be referred to as the "counter electrode". The polarity of the working electrode will be chosen in the light of the charge on the colloidal particles. Generally the colloidal particles employed in the process of the present invention are negatively charged and hence the working electrode is an anode. However by addition of an appropriate additive, e.g. cetyl trimethylammonium bromide, the charge on the colloidal particles may be changed such that they migrate to the cathode and the cathode is then the working electrode.

The working electrode may be self-supporting or it may be supported on a carrier. The carrier, where it is employed, may be flexible, e.g. a thermoplastic film, or rigid, e.g. a sheet of glass. Typical thermoplastics which may be employed as a carrier include polyethylene terephthalate, polyethersulphone and polyamide. Where a flexible carrier is employed, it may be such that the carrier, the substrate, and the film may be deformed, e.g. rolled up, with little or no deleterious effect on the film.

Material from which the working electrode may be made include metals, e.g. stainless steel, gold, platinum; metal oxides, e.g. tin oxide, tin-indium oxide; and elemental compound, or alloy semiconductors, e.g. silicon, cadmium telluride. Typical supported working electrodes include a metal coating on a thermoplastics film or a tin oxide coating on a glass sheet. Preferably the supported working electrode is a layer of gold on a thermoplastics film and the thermoplastics film is preferably polyethylene terephthalate.

Materials from which the counter electrode may be made include inter alia stainless steel, platinum, gold and tin oxide on glass. It is often preferred to surround the counter electrode, particularly where it is a cathode, with a so-called selective membrane which traps ions which might travel to the counter electrode and interfere with the electrodeposition process.

The working electrode is typically planar and, by employing a counter electrode of the same shape and size as the working electrode and disposed parallel to the surface thereof, uniform field distribution may be obtained. Where the counter electrode has a different shape to that of the planar working electrode, e.g. it may be a mesh, a wire, a corrugated sheet or a tube, non-uniform field distribution is obtained. Use of a planar working electrode and a counter electrode in the form of a linear wire often gives uniform film thickness.

Electrophoresis is preferably effected at pH between 3.0 and 8.0, particularly preferably at a pH between 4.0 and 5.0. Where such conditions are employed adhesion of the film to the surface of the substrate may be improved and an ohmic contact may be generated at the interface between the surface and the film, e.g. deposition of cadmium sulphide from a colloidal suspension having a pH between 4.0 and 5.0 on the surface of a stainless steel electrode generally produces an ohmic contact.

The distance between the electrodes may be chosen to obtain an optimum voltage gradient. Typically they are between 0.1 cm and 20 cm apart with an applied voltage of 0.1 to 1,000 v, preferably between 5 v and 350 v.

Typically the current density employed may be in the range 0.1 to 500 mA/cm$^2$, preferably it is between 0.5 and 10 mA/cm$^2$, although we do not exclude the possibility that pulsed currents having a current density above this range may be employed. The current density employed will depend inter alia on the distance between the electrodes and on the voltage applied, simple experiment will readily reveal a suitable current density for any particular application.

The film may be between 50 nm and 50,000 nm thick. Preferably the film is between 500 nm and 5000 nm thick since such films have an acceptable balance of mechanical and electrical properties, and good adhesion to the surface. Such films can usually be deposited in a relatively short time, which time depends on the operating parameters employed and typically is in the range 30 seconds to 30 minutes.

While the film may be transferred from the surface on which it was deposited to a second surface, e.g. by transfer coating, preferably the film is maintained in permanent contact with the surface on which it was deposited such that the film and the substrate form a laminate, and more preferably a working electrode is employed which forms an ohmic contact with the film.

Preferably the surface of the substrate is cleaned prior to deposition of the film, e.g. by treatment with degreasing agent; or ultrasonically; or etched, e.g. with an ion beam or an etching fluid; or by electropolishing, to obtain good adhesion between the film and the surface.

Adhesion of the film to the surface of the substrate may be improved by incorporating a binding agent in the colloidal suspension, such binding agents which are well known in the electrophoretic art include inter alia, polyvinyl alcohol, polyvinyl pyrrolidone or guar gum. Where a binding agent is employed, it may subsequently be removed from the film. Where a binding agent is employed it should not be disadvantageous to the process or product of the invention.

Adhesion of the film to the surface may be improved by incorporating a gas suppressor in the colloidal suspension to suppress evolution of gas at the working electrode as outlined in our British Patent Application 20199/76.

The application of heat which preferentially heats one surface of the semiconducting film to establish a temporary temperature differential between the surfaces of the semiconducting film often improves the electrical and photochemical properties of the film. The said application of heat is conveniently effected by subjecting a first surface of the semiconducting film to electromagnetic radiation having a wavelength between $10^{-2}$ and $10^{-9}$ meters preferably between $10^{-3}$ and $10^{-6}$ meters, while the second surface of the film is cooled, or where the said second surface is in contact with a substrate, the substrate is cooled. Conveniently cooling is effected by contacting the said second surface (or the substrate) with a water cooled plate. Typically the temperature of the surface of the film on which the electromagnetic radiation is incident is raised to between 100° C. and 800° C., preferably to between 300° C. and 600° C. and the temperature of the other surface of the film is typically maintained below 100° C. While the electromagnetic radiation may impinge on the semiconducting film at any angle, preferably, it is perpendicular to the surface of the semiconducting film since this often further improves the electrical and photochemical properties thereof. Conveniently the radiation is emitted by an infra-red lamp although we do not exclude the possibility that any other suitable source of electromagnetic radiation may be employed, e.g. the sun or a laser. Typically the film is heated for between 1 and 8 minutes, preferably for between 2 and 5 minutes, although it will be appreciated that the length of time will depend on the source of electromagnetic radiation and may range from a few nanoseconds for a laser to many tens of minutes for an incandescent lamp. The film may be heated in any suitable atmosphere although it is often convenient to heat the film in air.

The heat treatment hereinbefore described is particularly useful where the semiconducting film is heated in contact with a heat sensitive substrate, e.g. a thermoplastic film, since one surface of the semiconducting film may be heated with little or no deleterious effect on the substrate.

This heat treatment may alter the composition and electrical properties of the semiconducting sulphides, sulphoselenides, selenides or tellurides employed in the present invention and a further treatment may be necessary to obtain the desired electrical properties. Such further treatments are well known in the semiconductor art and include for example, heating the film in the presence of e.g. sulphur, hydrogen or cadmium.

Films prepared according to the method of the present invention may contain a suitable dopant in order to modify their electrical and/or photoelectrical properties. Typically these dopants are elements from Groups Ib (e.g. copper, silver), IIIb (e.g. aluminium, gallium, indium), Vb (e.g. phosphorus), VIb (e.g. oxygen), VIIb (e.g. chloride, bromine, iodine) of the Periodic Table as shown in "Advanced Inorganic Chemistry" third edition 1972 by F A Cotton and G Wilkinson published by Interscience Publishers, New York.

Films prepared according to the present invention may be employed for example in a variety of devices. They may be employed in solid state devices such as solar cells, phosphor coatings, photosensitive coatings, acoustic surface wave devices, electroluminescent devices, thin film transistors, infra-red reflectors and in integrated circuits. They may also be employed as electrodes in photochromic devices or fuel cells or as protective coatings in batteries.

Films prepared according to the present invention may be conveniently employed in solar cells.

By "solar cell" we mean a photovoltaic device which is capable of converting electromagnetic radiation, typically sunlight, directly into direct current electricity as a result of absorption of the radiation by a semiconductor. The absorbed radiation generates pairs of positive and negative electronic charge carriers in excess of the thermal equilibrium concentrations of such carriers. The excess electronic charge carriers of opposite sign are separated at an electrical potential barrier and then migrate to means to conduct the current from the cell, e.g. electrical contacts, on either side of the barrier. The barrier may be a metal-semiconductor junction, a p-n junction, a semiconductor-insulator junction or a semiconductor-electrolyte junction.

The contacts are generally chosen to allow a maximum amount of radiation to penetrate to the vicinity of the junction. Often an anti-reflection coating is applied to the surface of the radiation-absorbing semiconductor on which the radiation is incident to reduce the amount of incident radiation lost by reflection therefrom.

Generally the cell is encapsulated to prevent ingress of water or oxygen into the cell which tend to reduce the life-time of the cell. It will be appreciated that encapsulation, where it is employed, will allow at least a proportion of any radiation incident on the cell to penetrate the cell.

Accordingly a further embodiment of the invention provides a process for the preparation of a solar cell comprising:

1. preparing a thin substantially pin-hole-free first film of a semiconducting sulphide, sulphoselenide, selenide or telluride by deposition and application of heat preferentially to one surface of the film to establish a temperature differential between the surfaces of the film,
2. forming a junction between the first film and an electrolyte or a second film, which second film comprises a metal, an insulator or a semiconductor having majority charge carriers of opposite electronic charge to the majority charge carriers in the first film and, where the junction is formed between two films, preferably heating the junction to improve the electrical contact between the films, the first film being in electrical contact with a first current conducting means, and the electrolyte or the second film, where it is a semiconductor or an insulator, being in electrical contact with a second current conducting means, at least one of the current conducting means allowing radiation incident thereon to penetrate to the junction.

Preferably the first film is formed by electrophoretic deposition, particularly preferably by electrophoresis of a colloidal suspension of the semiconductor or precursor thereof in an aqueous medium and more particularly preferably by depositing the first film on the first current conducting means. However, we do not exclude the possibility that the first film may be deposited by spraying, evaporation, sputtering, ion plating, screen printing or anodic growth, which techniques are known in the semiconductor art. Conveniently the first current conducting means and the second current conducting means, where it is employed, are electrical contacts.

Preferably an anti-reflection coating is applied to the surface of the film which is to be subjected to incident radiation and more preferably means are provided to reduce or prevent the ingress of water and/or oxygen into the cell.

Where the junction is formed between the first film and an electrolyte, the electrolyte and the material of the film are chosen such that little or no adverse reaction occurs between them. For example, where the electrolyte is aqueous, e.g. a solution or dispersion of a sulphide such as sodium polysulphide in water, the first film is preferably cadmium selenide. Where an electrolyte is employed it may be a liquid or a paste and it will be appreciated that means to retain the electrolyte in contact with the semiconducting film and with the current conducting means are often necessary, e.g. a glass capsule.

Where the junction is formed between the first film and a second film which is an insulator, the insulator may be organic or inorganic and the second film is preferably less than 10 nm thick. Examples of organic insulators which may be employed includes inter alia high thermal conductivity thermoplastics, e.g. poly-p-xylylene and derivatives thereof; thermosetting resins; fatty acids and their salts, e.g. stearic (particularly Cd, Ba and Ca), arachidic (particularly Cd, Ba and Ca); orthophenanthroline. Usually long chain molecules are employed but short chain molecules are not excluded. This aspect is described more fully in our UK Patent Application No 34264/75. Examples of inorganic insulators which may be employed as the second film are glass, sapphire and aluminium oxides.

Where the junction is formed between the first film and a second film which is a semiconductor having majority charge carriers of opposite electronic charge to the majority charge carriers in the first film, i.e. a p-n junction is formed, preferably the two films are of different material, i.e. a heterojunction is formed, although we do not exclude the possibility that both films comprise the same material doped with different dopants, i.e. a homojunction is formed, e.g. cadmium telluride doped with iodine and cadmium telluride doped with phosphorus. Suitable dopants, e.g. iodine and phosphorus, and methods for incorporating them into a film, e.g. diffusion, are well known in the semiconductor art. Where the junction is a p-n heterojunction, preferably the second film comprises a compound based on monovalent cations selected from Group IB of the Periodic Table as hereinbefore described, although we do not exclude the possibility that the second film may be a semiconducting element, or a compound or alloy thereof or an organic semiconductor. Particularly preferably the monovalent cations are copper and more particularly preferably the second film comprises copper (I) sulphide. Precursors of the semiconducting inorganic compounds which may be employed as the second film are well known in the art, as are methods for their conversion to semiconductors, and for copper sulphide they include for example, copper and copper (I) chloride which on heating in the presence of sulphide ions are converted into copper (I) sulphide.

Where the junction is formed between the first film and a second film which is an organic semiconductor typical organic materials include inter alia phthalocyanine, violanthrene, porphyrins, charge transfer complexes and derivatives of anthracene, of tetracene, of naphthalene, of pyrene and of perylene.

Where the junction is formed between two films the second film is preferably generated on the first film. Generation may be by any convenient technique, for example, evaporation, electrophoretic deposition, ion dipping, electroless deposition, electroplating, solid state reaction, or the so-called Langmuir technique. Alternatively, a preformed second film may be engaged with the first film, e.g. by transfer coating.

Where the second film is an inorganic semiconductor having majority charge carriers of opposite electronic charge to the majority charge carriers in the first film, (particularly where the second film comprises a compound based on a monovalent cation of an element of Group IB of the Periodic Table as hereinbefore described), the second film is preferably subjected to infrared radiation to heat the junction between the first and second films since this often gives solar cells of improved efficiency.

Where the second film is an organic insulator preferably it is prepared by the so-called Langmuir technique in which a mono-molecular layer of the organic material is formed upon the surface of a suitable liquid, hereinafter referred to as the "supporting subphase", and the first film is passed through the layer so that a monomolecular film of the organic material is deposited upon the surface of the first film. While the second film may be a mono-molecular layer, it is often preferred to deposit a plurality of mono-molecular layers by the so-called Langmuir technique to produce a film having a thickness of less than 10 nm.

Where the second film is an organic semiconductor it may be prepared by the Langmuir technique and it will usually be found desirable to increase the thickness of the second film by repeated applications of monomolecular layers of the same material such that the thickness is typically between 10 nm and 500 nm.

Thus, solar cells may be prepared having either mono-molecular or multimolecular organic layers, the multi-molecular layers being formed by repeated passage of the first film through a layer particularly a mono-molecular layer of the organic material supported on an appropriate supporting subphase.

The process for the deposition by the Langmuir technique of layers of an organic material, where an organic material is employed as the second film, is described in outline below; the detailed use of the Langmuir technique in relation to the deposition of films of preferred organic materials is described in British Patent Application No 34264/75.

The supporting subphase is preferably one which is inert to the organic material, that is, it does not react chemically with the material of the layer, and to the first film under the conditions employed in the process of the invention, (although on occasions it may be desirable to include materials which do not act disadvantageously with the film), nor will it usually be a solvent for the organic material although some solubility is not necessarily detrimental so long as the organic film is not thereby destroyed or its formation prevented. The supporting subphase may be an organic or inorganic liquid; usually we prefer to use water, although the presence of certain inorganic ions may improve the stability of the organic layer.

Formation of the monomolecular layer of the organic material on the surface of the supporting subphase is most conveniently effected by applying to the surface of the supporting subphase an appropriate volume of a solution of the organic material in a volatile solvent which is immiscible with the supporting subphase under the process conditions employed. The concentration of the organic material in the solution is selected such that the evaporation of the solvent leaves behind a layer of the desired thickness on the surface of the supporting subphase.

Transfer of the organic material to the first film is effected by dipping the first film into the supporting subphase and withdrawing it again, so that a coherent film of organic material adheres to the surface of the first film. Provision of means for maintaining the integrity of the film of organic material on the supporting subphase is necessary and this means can comprise a sweep or paddle, preferably responsive to a microbalance which constantly measures the pressure of the film upon the supporting subphase. This feature of maintaining pressure upon the film is important for the production of an aligned continuous organic film upon the first film.

Where an electrolyte is employed or the second film is a semiconductor or an insulator, the cell is provided with a second electrical contact which makes electrical contact with the electrolyte or the second film.

Where the second film is a semiconductor or an insulator the second electrical contact is typically a gold or copper mesh, which for example, may be evaporated onto the second film, or deposited electrophoretically thereon, or screen printed thereon, or applied as preformed mesh, e.g. a gold plated copper mesh or a silver mesh. Alternatively the second film may be formed on a second substrate, and then engaged with the first film to form the junction in which case the second substrate, where it has suitable conductivity, may conveniently form the second electrical contact. Where an electrolyte is employed, the second electrical contact is in contact with the electrolyte and typically comprises platinum.

Where the second film is a metal, it is conveniently employed as the second electrical contact. Where the second film is a metal we do not exclude the possibility that it may contain perforations, e.g. it may be in the form of a mesh.

Where the second electrical contact is in the form of a mesh, typical line widths and spacings of the lines may conveniently be determined from the equations disclosed in "Proceeding of the Institute of Radio Engineers, Volume 48, 1960 page 1246".

Solar cells from a few millimeters square to many meters square may be prepared by the process of the invention. It is often convenient, e.g. for solar cells having a surface area of more than 500 sq cm, for the second film to be in the form of discrete portions which are in electrical contact with the second contact.

It will be appreciated that where means to reduce or prevent the ingress of water and/or oxygen into the cell is employed, the said means will allow contact to be made between the current conducting means and an electrical circuit external of the cell.

It will be appreciated that the shape and disposition of the first and second current conducting means must be such that they do not form a short-circuit within the cell.

It will be appreciated that at least one of the current conducting means and, where means to reduce or prevent the ingress of water and/or oxygen into the cell is employed, the said means will allow at least a proportion of any electromagnetic radiation incident on the cell to penetrate to the junction. For example, the material of the current conducting means may be translucent or transparent and/or the current conducting means may contain perforations, e.g. they may be in the form of a mesh. Preferably the said means for reducing or preventing the ingress of water and/or oxygen, where it is employed, is transparent to electromagnetic radiation.

The invention will be further described by reference to the accompanying drawings which show, by way of example only, one embodiment of the invention. In the accompanying drawings.

Figure 1:
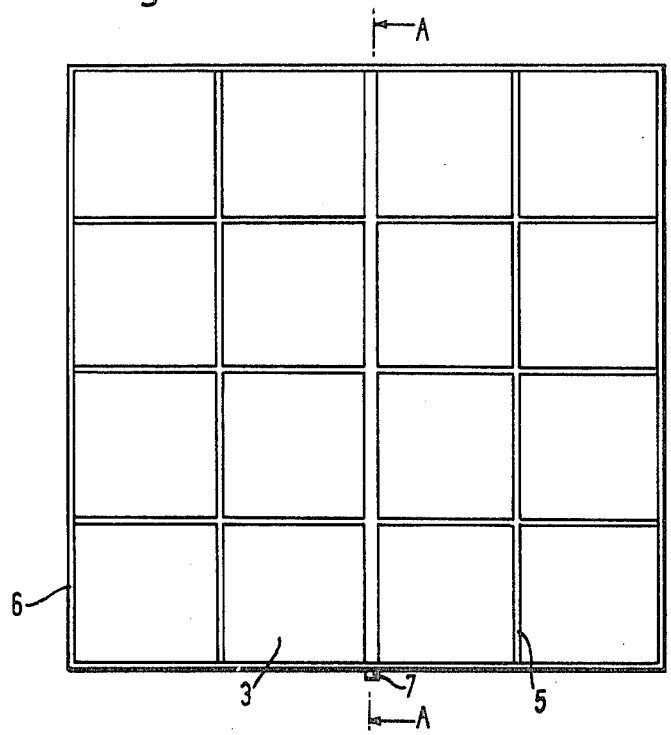
FIG. 1 is a plan view of a solar cell prepared by the method of the present invention.
Figure 2:
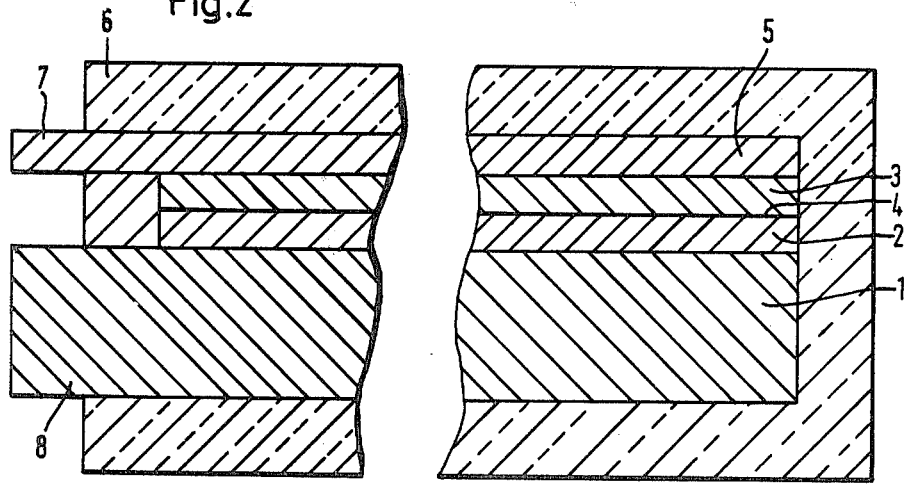
FIG. 2 is a cross-section on the line AA of FIG. 1.

In FIGS. 1 and 2 a surface of a stainless steel electrical contact 1 is in ohmic contact with a cadmium sulphide film 2, 1000 nm thick, which has been electrophoretically deposited thereon and to one surface of which heat has been applied to establish a temperature differential between the surfaces of the film. A copper (I) sulphide film 3 forms a p-n junction 4 with the cadmium sulphide film 2. A second electrical contact in the form of a copper mesh 5 is bonded with conducting gold epoxy onto the copper (I) sulphide film 3 and a capsule 6, which may be for example of glass, encapsulates the device. Proportions 7, 8 of the electrical contacts project through the capsule to form contacts for connection to an external electrical circuit. The projections 7, 8 are sealed into the capsule with an appropriate sealant e.g. an epoxy resin. Prior to sealing the device is filled with nitrogen.

The invention is further illustrated by the following Examples.

EXAMPLE 1

250 mls of 0.02 M solution of cadmium acetate in distilled water and hydrogen sulphide (at 5 ml/min) were separately added with stirring to 250 ml of water over 20 minutes. At the end of this time conversion into a colloidal suspension of cadmium sulphide was judged to be complete. Nitrogen was passed over the suspension for 1 to 3 minutes and ammonium hydroxide was then added to change the pH of the colloidal suspension from between 2.5 and 3.5 to between 3.5 and 5.0. The suspended cadmium sulphide particles were approximately 20 nm in size.

120 parts by volume of methanol were added to 30 parts by volume of the colloidal suspension. A polyethylene terephthalate film, 19 sq cm in area, having a layer of gold (approximately 1000 nm thick) ion-plated thereon, and a stainless steel wire, 2 mm in diameter, fixed 60 mm apart were immersed to a depth of 5 cm in the suspension. The metallised film was attached to a glass slide to keep it rigid. The metallised film was an anode and the wire was a cathode. 190 volts was applied between the metallised film and the wire and the initial current was approximately 50 mA. The anode and the cathode were oscillated through the suspension for 3 minutes until a sufficiently thick film was obtained. The laminate consisting of the metallised film and the attached film of cadmium sulphide was removed from the suspension and then air dried. The cadmium sulphide film was approximately 1000 nm thick.

The laminate was held by vacuum on a water-cooled plate with the cadmium sulphide film uppermost. Infrared radiation from a 150 w lamp was directed at the cadmium sulphide film from a distance of 0.14 meters for 2 minutes. The temperature of the cadmium sulphide film rose to 500° C. and the temperature of the polyethylene terephthalate film film rose to 70° C.

A sample of the heat treated laminate was then dipped repeatedly into a trough containing a sub-phase of ultrapure water containing cadmium chloride ($2.5 \times 10^{-4}$ M) at pH 6.2 and carrying a monomolecular film of 9-n-butyl-10-(2-carboxyethyl) anthracene applied to the subphase in a 1 mg/ml solution in chloroform. The sample was immersed vertically, its planar surface being at right angles to the surface of the subphase. Dipping speed was 3.7 mm/min and the surface pressure on the film was 30±1. 40 layers of cadmium arachidate were applied to the sample. After each immersion the sample was air dried at 20° C. for 1 minute; after completion of dipping it was dried in a desiccator for one day.

A grid-shaped gold electrode (40 nm thick) was then applied by evaporation through a mask, to the surface of the anthracene derivative and the device was tested as a solar cell.

EXAMPLE 2

A monomolecular layer of cadmium arachidate was deposited by the dipping technique of Example 1 on the cadmium sulphide surface of a sample of the heat treated laminate prepared in Example 1. A grid-shaped gold electrode was then applied to the surface of the monomolecular layer of cadmium arachidate by evaporation through a mask and the device was tested as a solar cell.

EXAMPLE 3

A sample of the heat treated laminate prepared according to Example 1 was placed in an Edwards Vacuum Coating Unit which contained copper sulphide in a tantalum boat. The unit was evacuated to $10^{-4}$ Torr, and a current of 25 amps was applied to the boat for 1 minute 30 seconds to produce a film of copper sulphide on the cadmium sulphide film.

The copper sulphide coated laminate was held by vacuum on a water-cooled plate with the copper sulphide film uppermost. Infra-red radiation from a 150 w lamp was directed at the copper sulphide film from a distance of 0.14 m for 3 minutes.

A grid-shaped gold electrode (40 nm thick) was then applied by evaporation through a mask to the surface of the copper sulphide film and the device was tested as a solar cell.

EXAMPLE 4

A colloidal suspension of cadmium sulphide in water/methanol was prepared as in Example 1. A substrate in the form of a stainless steel plate of area 19 sq cm, and a stainless steel wire, 2 mm in diameter, fixed 40 mm apart were immersed to a depth of 5 mm in the suspension. The plate and the wire were connected to an electrical circuit to form the anode and the cathode respectively. 200 volts was applied between the electrodes and the initial current was approximately 10 mA. The electrodes were oscillated through the suspension for 3 minutes to produce a film of cadmium sulphide, 600 nm thick. The laminate consisting of the substrate and the attached film was removed from the suspension and dried in air. The laminate was held on a water-cooled plate with the cadmium sulphide film uppermost. Infra-red radiation from a 150 w lamp was directed at the cadmium sulphide film from a distance of 0.14 meters for 2 minutes.

A film of copper sulphide was deposited on the heat treated laminate using the process of Example 3. The copper sulphide coated laminate was then heated in an oven at 200° C. for 15 minutes.

A grid-shaped gold electrode (40 nm thick) was then applied by evaporation through a mesh to the surface of the copper sulphide film and the device was tested as a solar cell. On illumination with a "⅓ sun" it gave an open circuit voltage of 120 mV and a current of 200 mA.

EXAMPLE 5

A copper sulphide coated laminated was prepared according to Example 4 except that the cadmium sulphide film was 400 nm thick and was irradiated with infra-red radiation for 2 minutes.

Three solar cells were prepared from the copper sulphide coated laminate and the results shown in Table 1 were obtained.

TABLE 1

| Cadmium Sulphide/Copper Sulphide Solar Cells | | | |
| --- | --- | --- | --- |
| | | Open Circuit | |
| Electrode | Illumination | Voltage (mV) | Current (μA) |
| Spot | Ambient | 20 | 2 |
| Grid | Ambient | 15 | 25 |
| Grid | ⅓ sun | 70 | 140 |

What we claim is:

1. A method for the preparation of a thin substantially pin-hole-free film which method comprises the deposition of a film of a semiconducting sulphide, sulphoselenide, selenide or telluride of cadmium, zinc, mercury, copper (I), lead, or other suitable metal or precursor thereof on a surface of a substrate by electrophoresis of a colloidal suspension of colloidal particles of the semiconductor or precursor thereof in an aqueous medium, said particles having an average diameter between 1 and 100 nm, and the application of heat preferentially to a first surface of the film to raise the temperature of the said first surface to between 300° C. and 600° C. while the temperature of a second surface of the film is kept below 100° C.

2. A method for the preparation of a film according to claim 1 wherein colloidal particles of the semiconductor or precursor thereof are formed in water and a polar organic liquid is added to the water prior to electrophoresis to form a colloidal suspension of the semiconductor or precursor thereof in an aqueous medium.

3. A method for the preparation of a film according to claim 2 wherein the semiconductor or precursor thereof is prepared in the water.

4. A method for the preparation of a film according to claim 1 wherein the said substrate is a working electrode in an electrical circuit.

5. A method for the preparation of a film according to claim 4 wherein the working electrode is supported on a carrier.

6. A method for the preparation of a film according to claim 5 wherein the carrier is flexible.

7. A method for the preparation of a film according to claim 6 wherein the working electrode is gold and is supported on a thermoplastic film.

8. A method for the preparation of a film according to claim 1 wherein the first surface of the film is subjected to electromagnetic radiation having a wavelength between $10^{-2}$ and $10^{-9}$ meters.

9. A method for the preparation of a film according to claim 8 wherein the radiation is infra-red radiation.

10. A method for the preparation of a film according to claim 8 wherein the second surface of the film is cooled.

11. A method for the preparation of a solar cell comprising the steps of preparing a thin substantially pin-hole-free first film of a semiconducting sulphide, sulphoselenide, selenide or telluride, forming a junction between the first film and an electrolyte or a second film which second film comprises a metal, an insulator or a semiconductor having majority charge carriers of opposite electronic charge to the majority charge carriers in the first film, the first film being in electrical contact with a first current conducting means and the electrolyte or the second film, where it is a semiconductor, or an insulator, being in electrical contact with a second current conducting means, at least one of the current conducting means allowing radiation incident thereon to penetrate to the junction characterised in that the first film is prepared by a process as claimed in claim 1.

12. A method for the preparation of a solar cell as claimed in claim 11 wherein the first film is electrophoretically deposited on the first current conducting means.

13. A method for the preparation of a solar cell as claimed in claim 11 characterised in that where the junction is between two films, the second film is generated on the first film and the junction is heated to improve electrical contact between the films.

14. A method for the preparation of a solar cell as claimed in claim 13 wherein the junction of a p-n junction.

15. A method for the preparation of a solar cell as claimed in claim 14 wherein the junction is a heterojunction.

16. A method for the preparation of a solar cell as claimed in claim 15 wherein the second film comprises a compound based on monovalent cations selected from Group IB of the Periodic Table.

17. A method for the preparation of a solar cell as claimed in claim 16 wherein the monovalent cation is copper.

18. A method for the preparation of a solar cell as claimed in claim 17 wherein the second film comprises copper (I) sulphide.

19. A method for the preparation of a solar cell as claimed in claim 13 comprising the step of providing means to reduce or prevent the ingress of oxygen and/or water into the cell, said means allowing electrical contact to be made between the said current conducting means and an electrical circuit external to the cell.

20. A method for the preparation of a solar cell as claimed in claim 11 comprising the step of providing an anti-reflection coating to reduce or prevent the reflection of incident radiation from the surface of the film which is to be subjected to the incident radiation.

* * * * *